United States Patent [19]

Haisma et al.

[11] Patent Number: 4,983,251
[45] Date of Patent: Jan. 8, 1991

[54] METHOD OF MANUFACTURING SEMICONDUCTOR DEVICES

[75] Inventors: Jan Haisma; Theodorus M. Michielsen; Jan A. Pals, all of Eindhoven, Netherlands

[73] Assignee: U.S. Philips Corporation, New York, N.Y.

[21] Appl. No.: 874,748

[22] Filed: Jun. 16, 1986

[30] Foreign Application Priority Data

Jun. 20, 1985 [NL] Netherlands .................... 8501773

[51] Int. Cl.$^5$ ........................................... H01L 21/02
[52] U.S. Cl. .................................. 156/630; 156/629; 156/662; 65/36; 65/155; 437/62; 437/225; 437/922; 437/974; 148/DIG. 12
[58] Field of Search ............... 156/628, 630, 643, 662, 156/663, 665, 629; 65/17, 36, 40, 42, 43, 33, 60.5, 63, 111, 120, 155; 437/974, 922, 226, 62; 148/D12

[56] References Cited

U.S. PATENT DOCUMENTS

| | | | |
|---|---|---|---|
| 3,997,381 | 12/1976 | Wanlass | 156/3 |
| 4,465,547 | 8/1984 | Belke et al. | 156/629 |
| 4,526,649 | 7/1985 | Gupta et al. | 156/629 |
| 4,671,846 | 6/1987 | Shimbo | 156/629 |
| 4,689,111 | 8/1987 | Chan et al. | 156/629 |
| 4,714,517 | 12/1987 | Malladi et al. | 156/629 |

FOREIGN PATENT DOCUMENTS

| | | | |
|---|---|---|---|
| 0136050 | 4/1985 | European Pat. Off. | |
| 0020872 | 2/1978 | Japan | 156/629 |
| 0066084 | 5/1979 | Japan | |
| 0030374 | 2/1982 | Japan | |
| 0069523 | 4/1982 | Japan | 156/629 |
| 0084458 | 5/1983 | Japan | 156/629 |
| 0123770 | 7/1983 | Japan | |
| 0120577 | 6/1985 | Japan | |
| 0191038 | 8/1986 | Japan | 156/629 |

OTHER PUBLICATIONS

Ohashi et al, "Improved Dielectric Isolated ... (SDB) Technique", IEDM 86, 4/1986, pp. 210–213.
Furukawa et al, "Lattice Configuration ... Bonded Silicon", Extended Abs of 18th Conf on S.S. Devices & Materials Tokyo, 1986, pp. 533–536.
Lasky, "Wafer Bonding ... Technologies", Appl. Phys. Lett 48(1), 1/6/1986, pp. 78–80.
Nakagawa et al, "1800 V Bipolar-Mode ... to a Power Device", IEDM 86, 4/1986, pp. 122–125.
Lasky et al, "Silicon-on-Insulator ... and Etch-Baack", IEDM-85, 4/1985, pp. 684–687.
Black et al, "Silicon and Silicon Dioxide Thermal Bonding", Mat. Res. Soc. Symp. Proc., vol. 107, 1988.
Shimbo et al, "Silicon to Silicon Direct Bonding Method", J. Appl. Phys. 60(8), 10/15/86, pp. 2987–2989.
Kimura et al, "Epitaxial Film ... Insulating Substrate", Applied Physics Letters 43(3), Aug. 1983.

Primary Examiner—David Simmons
Assistant Examiner—Lori-Ann Johnson
Attorney, Agent, or Firm—Paul R. Miller

[57] ABSTRACT

A method for manufacturing a semiconductor device comprising at least a support body and a monocrystalline semiconductor body, in which both bodies are provided with at least one flat optically smooth surface obtained by means of bulk-reducing polishing (mirror polishing), and at least the semiconductor body is then provided at the optically smooth surface with an electrically insulating layer with at least the electrically insulating layer on the semiconductor body being subjected to a bonding-activating operation, whereupon both bodies after their flat surfaces have been cleaned, are contacted with each other in a dust-free atmosphere in order to obtain a rigid mechanical connection, after which they are subjected to a heat treatment of at least 250° C., whereupon the semiconductor body is etched to a thin layer having a thickness lying between 0.05 and 100 μm.

43 Claims, 4 Drawing Sheets

METHOD OF MANUFACTURING SEMICONDUCTOR DEVICES

The invention relates to a method of manufacturing semiconductor devices comprising at least a support body and a monocrystalline semiconductor body, in which both bodies are provided with at least one flat optically smooth surface obtained by means of bulk-reducing polishing (mirror polishing) and at least the semiconductor body then is provided at the optically smooth surface with an electrically insulating layer, which two bodies, after their flat surfaces have been cleaned, are contacted with each other in a dust-free atmosphere in order to obtain a mechanical connection, after which they are subjected to a heat treatment of at least 350° C.

The invention has for its object to obtain monocrystalline layers on an insulator (also designated as SOI=-Silicon on Insulator). Semiconductor layers on an insulator are becoming of great interest in semiconductor technology. In fact, in the case of SOI, thin semiconductor layers can be used very advantageously for obtaining semiconductor devices of high performance. This high performance is due inter alia to the fact that disturbances in the support below this layer, for example, caused by external radiation do not influence the operation of a semiconductor device, which will indeed be the case if the semiconductor body itself acts as a support (SOI is insensitive to radiation). With thin semiconductor layers, circulation currents do not occur either around semiconductor devices provided in these layers (latch-up).

It is known to grow thin silicon layers epitaxially on sapphire. Since sapphire has a hexagonal crystal structure and silicon has a cubic crystal structure, however, these layers mostly exhibit crystal irregularities, as a result of which the application is limited. It is also known to obtain monocrystalline silicon on an insulator by implanting oxygen ions in a wafer of monocrystalline silicon and then carrying out a heat treatment (annealing), in which a buried layer of silicon oxide is obtained. The apparatus for carrying out this process is extremely complicated and expensive, however, and this process is very time-consuming for larger surfaces of, for example, 10 cm in diameter. It is further known to convert a polycrystalline silicon layer on an insulator into a monocrystalline layer by means of laser annealing. This process is very time-consuming. In all these cases, it is further very difficult to obtain a uniform homogeneous monocrystalline layer of reasonable size; in the case of laser annealing, the uniform regions are, for example, only 0.01 square mm.

Other recrystallization methods are lamp heating and strip heater. They both have the disadvantage that the temperature of the support of the semiconductor layer becomes high (1100° C. or higher). On the contrary, larger monocrystalline domains of, for example, 1 cm² are then formed, but these domains are not free from defects.

In the European Pat. No. 136050 a bonding technique is described which is known under the designation of "wringing". The object is in this case to avoid in a semiconductor pressure converter an erroneous determination of the pressure by ensuring that the bond does not influence the measurement. This publication does not relate, however, to a method of obtaining a semiconductor layer on an insulator.

The present invention has for its object to provide a semiconductor device comprising a thin semiconductor layer on an insulator, in which a uniform homogeneous monocrystalline layer is obtained by comparatively simple means and in which dimensions of 7.5 cm and larger can be readily attained. The invention is based on the recognition of the fact that the wringing technique known per se may also constitute an auxiliary means for obtaining a thin semiconductor layer on an insulator and that particular processing steps then permit obtaining of such a good bond between the insulating layer and the semiconductor layer that during further processing steps used in semiconductor technology the adhesion remains perfect.

In order to achieve this object, a method of the kind mentioned in the opening paragaraph is characterized in that, before the bodies are contacted with each other, at least the electrically insulating layer on the semiconductor body is subjected to a bonding-activating treatment, in that then a very intimate bond between the surfaces is established and in that subsequently the semiconductor body is thinned by etching to a predetermined value lying between 0.05 and 100 micrometer ($\mu$m).

The term "bonding-activating treatment" is to be understood to mean a treatment which ensures that many atoms at the surface of the layer become bonding-active. Due to this increase of the number of bonding points, a very strong adhesion can be obtained. Due to the bonding-activating treatment, it is achieved that at least 50% of the optically smooth surfaces are subjected to a van der Waals bonding. The layer of monocrystalline semiconductor material, which is then thinned by etching, also retains after further processing steps usual in semiconductor technology a very strong adhesion to the insulating layer of the support. The semiconductor layer can be thinned by etching to a given value; it retains its uniform homogeneous monocrystalline character, while its dimensions can be equally large as those of the original semiconductor body.

In order to realize integrated circuits, the ultimate thickness of the layer will preferably have a value lying between 0.1 and 1 $\mu$m. For power transistors, a thickness lying between 1 and 20 $\mu$m is particularly suitable.

The bonding-activating treatment may consist of a light surface smoothing treatment, in which mainly microscopic unevennesses are smoothed. A chemical etching treatment is also suitable for forming additional bondings at this surface. A further possibility consist in that a layer of wet-chemical spin glass (silicon oxide in an organic solvent that can be processed to a thin layer by centrifuging) is provided, the organic substance is removed therefrom at a temperature of about 200° C. and the whole is densified to glass at a temperature of at least 800° C.

The operation of thinning by etching can be carried out with an isotropic etching treatment and furthermore, when an epitaxial semiconductor layer has been grown on the semiconductor body, with an electrochemical etching treatment. In the latter case, the etching step is stopped on the non-conducting layer and thus there can be thinned by etching to any desired thickness.

The method according to the invention may advantageously be used in the manufacture of bidimensional semiconductor devices. The invention may further be utilized for forming MOS FET's in an $A^{III}B^{V}$ material, such as gallium arsenide. The invention further provides the possibility of forming three dimensional stack IC's. In these stacked IC's, electrical elements, and also other elements, such as, for example, magnetic and optical elements, may be formed. These and further embodiments of the invention are explained more in detail in the following description with reference to the drawing.

Figure 1:
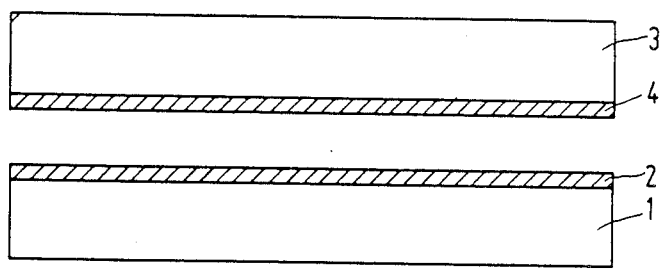
FIG. 1 shows a support body and a semi-conductor body before bonding these bodies to each other.
Figure 2:
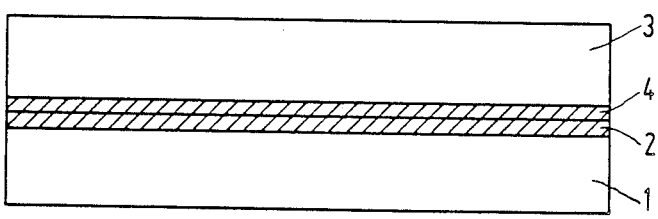
FIG. 2 shows the bodies of FIG. 1 after bonding.
Figure 3:
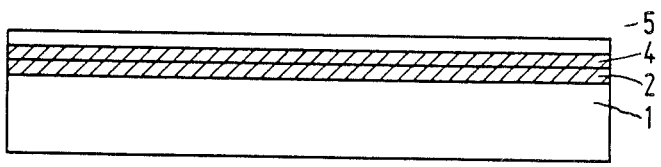
FIG. 3 shows the formed thin semiconductor layer from the assembly of FIG. 2.

FIGS. 1 to 3 show a first embodiment of obtaining a thin semiconductor layer on an insulating support. FIG. 1 shows the support 1, which may consist, for example, of silicon and on which a silicon oxide layer 2 is provided. A semiconductor body 3 may also consist of silicon and may be provided with a silicon oxide layer 4. The surface of the two bodies were flattened and smoothed before oxidation by means of a bulk-reducing polishing treatment. In such a polishing treatment, at least 10 μm of material is removed. After oxidation, the oxide layer 4 of the semiconductor body and, as the case may be, also the layer 2 of the support body are subjected to a bonding-activating operation. This is an operation which ensures that atoms at the surface of the layer obtain additional bonds. The bonding-activating operation may consist, for example, of a light etching of the surface layer. Another possibility is to carry out a surface smoothing operation, in which mainly microscopic unevennesses are smoothed. A still further possibility is to spin a wet-chemical glass on the surface to a thin layer, to evaporate the solvent from the layer of wet-chemical glass and to densify the glass at a temperature above 800° C.

The two bodies, are contacted with each other by the layers 2 and 4 after having been cleaned in a dustfree atmosphere (FIG. 2). A spontaneous adhesion then occurs, designated as "wringing". Due to the bonding points in the surface of the layers 2 and 4 owing to the bonding-activating operation, the adhesion is very strong here. At least 50% of the optically smooth surfaces are then subjected to a Van der Waals bonding. When the entire body is subjected to a heat treatment of at least 350° C., the adhesion effect is still increased.

In order to obtain a thin semiconductor layer on an insulator, the semiconductor body 3 is subjected to an etching treatment. In the embodiment shown in FIGS. 1 to 3, the semiconductor material has a uniform doping or it may be intrinsic. A known isotropic etching treatment is then used. The isotropic etching has the additional advantage that a very smooth etching is obtained, but a constancy of thickness over larger surfaces can be less accurately controlled.

The thin semiconductor layer thus obtained and shown in FIG. 3, which is provided on a support in an insulating manner, continuously has a perfect adhesion. Also further processing steps usual in semiconductor technology in the thin semiconductor layer 5 do not lead to this adhesion being lost. By means of the method according to the invention, a thin semiconductor layer on an insulator is obtained in which the monocrystalline semiconductor material of the layer 5 is uniformly homogeneous. The lateral dimensions of the layer can be equally large as those of the starting material, i.e. the semiconductor body 3. Thus, extraordinarily large regions in thin layers of monocrystalline semiconductor material on an insulator can be obtained, for example of 7.5 cm diameter and larger.

In the embodiment described, the bodies 1 and 3 consists of silicon. However, this is not necessary. The semiconductor body 3 may also consist of, for example, galliumarsendic and the like. A combination of different semiconductor materials is also possible. The support body could also consist, for example, of quartz glass or could be composed of different materials. The oxide layer in the case of silicon may simply be provided thermally. In the case of other support materials, for example silicon oxide may be applied pyrolytically.

Figure 4:
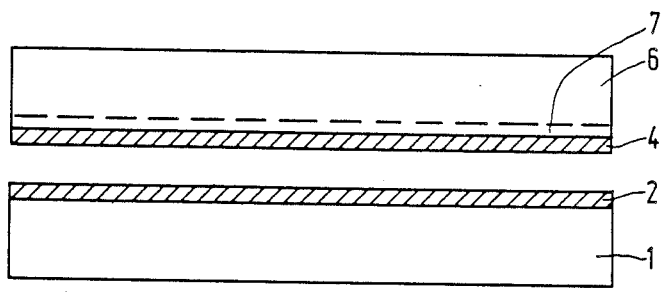
FIG. 4 shows a support body and a semiconductor body before bonding these bodies to each other according to a second embodiment.
Figure 5:
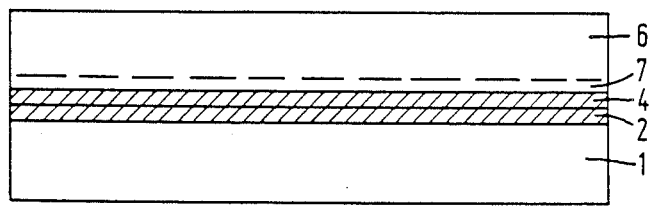
FIG. 5 shows the bodies of FIG. 4 after the bonding operation.
Figure 6:
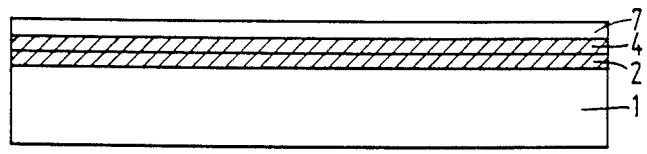
FIG. 6 shows the formed thin layer from the assembly of FIG. 5.

FIGS. 4 to 6 roughly show the same process as described with reference to FIGS. 1 to 3. However, in this case first a thin layer 7 of silicon is grown epitaxially on the semiconductor body 6. The semiconductor consists, for example, of highly doped n-type silicon and the epitaxial layer could consist of intrinsic silicon. Up to and including the step of thinning by etching, the method is identical to that described with reference to FIGS. 1 to 3. After wringing and the subsequent heat treatment, an electrochemical etching step is now carried out. The highly doped n-type silicon is etched away completely and the etching step is automatically stopped where the epitaxially grown silicon layer begins. The thickness of the thin semiconductor layer 7 of FIG. 6 is consequently determined in this case by the thickness of the layer grown epitaxially on the semiconductor body 6.

In this way it is possible to carry out the step of thinning by etching with great accuracy. Depending upon further applications, this value can lie between 0.05 and 100 μm. When used for the formation of integrated circuits, the thickness will mostly be chosen between 0.1 and 1 μm. When used, for example, for power transistors, a thickness between 1 and 20 μm is suitable.

FIGS. 7 to 10 show a further operation, in which the "thin silicon on insulator" is used to obtain a bidimensional pattern of mutually insulated semiconductor regions, the entire structure having a flat surface.

Figure 7:
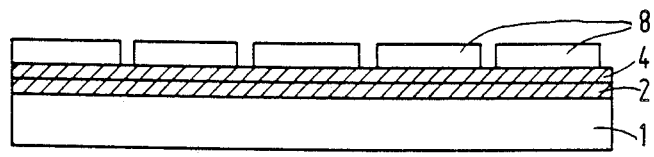
FIG. 7 shows an assembly of FIG. 3 or FIG. 6 with insulated regions formed in the thin semiconductor body.
Figure 8:
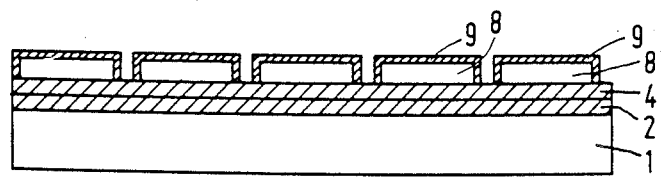
FIG. 8 shows the assembly of FIG. 7 with oxide thermally grown on the insulated regions.
Figure 9:
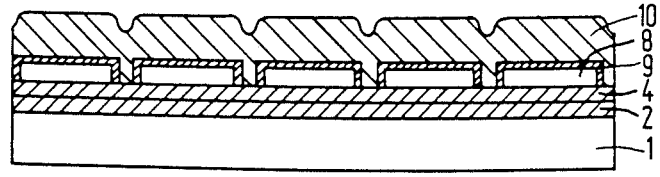
FIG. 9 shows the assembly of FIG. 8, on which further oxide is deposited.
Figure 10:
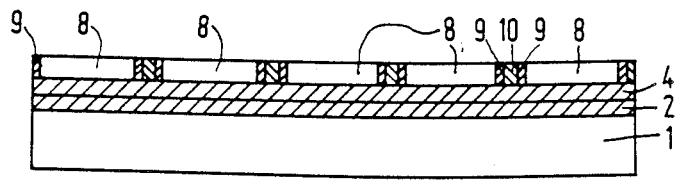
FIG. 10 shows the assembly formed after planarization with mutually insulated regions.

FIG. 7 shows the assembly, in which separate silicon regions 8 are formed in the thin semiconductor layer after a photosensitive lacquer has been applied, a masking step has been carried out, a developing step and subsequently an etching step are effected. FIG. 8 shows the assembly after a thermal oxide layer 9 has been provided on the regions 8. A layer 10 of silicon oxide, for example pyrolytic silicon oxide, is now deposited in the space between the regions 8 and also above the regions 8 (FIG. 9). If the embodiment is such that this space is filled entirely by growing thermal oxide 9, a deposition step of $SiO_2$ is not required for filling the groove. The layer 10 is planarized in a manner known per se, in which operation the entire quantity of silicon oxide is etched away at least as far as the upper side of the regions 8. Ultimately, an element is then formed (FIG. 10) consisting of a support, on which a number of regions 8 are disposed in an electrically insulated manner, which regions 8 are mutually insulated by the remaining silicon oxide 9, 10, while the entire upper side constitutes a flat surface. In each of the regions 8, separate semiconductor elements, such as diodes and transistors, can now be provided, an assembly of which can form an integrated circuit.

Figure 11:
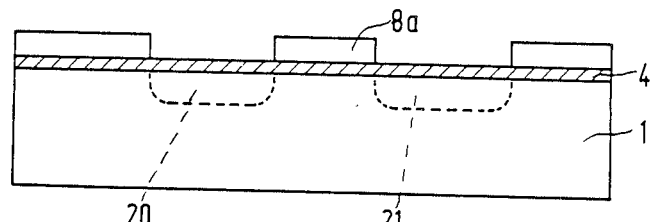
FIGS. 11 and 12 show an embodiment, which permits of obtaining MOS FET's in an $A^{III}B^V$ material.
Figure 12:
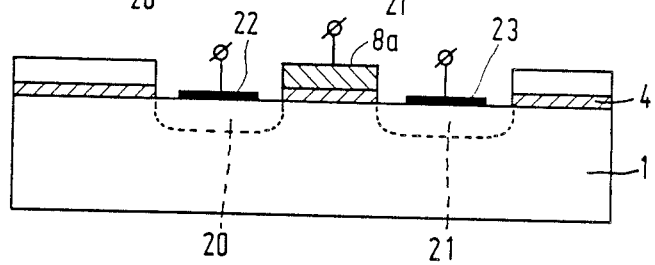

The invention is also particularly suitable for the formation of MOS FET's in AIII-BV materials, such as gallium arsenide, gallium aluminium arsenide and the like. MOS FET's in these materials have the great advantage that they can switch rapidly because the electrical charge carriers have high mobilities. However, it is difficult to provide on these materials an oxide of sufficient electrically insulating quality. The most ideal form of oxide, i.e. the thermally formed oxide, is not possible with AIII-BV materials. The invention nevertheless provides the possibility of obtaining this favourable form of MOS FET's. In FIG. 11, the support body 1 consists of an AIII-BV material, for example gallium arsenide. In the manner described with reference to FIGS. 1 to 3 or FIGS. 4 to 6, a semiconductor silicon body is provided thereon by means of wringing. A layer 4 of thermal silicon oxide was grown on the silicon body. By means of wringing, a layer of the particularly suitable thermally grown silicon oxide 4 is thus formed on the gallium arsenide body. The thin silicon layer 4 is etched so as to form separate parts 8a, of which only one is shown in FIGS. 11 and 12. Doped regions 20 and 21 of the n-type constituting the source and the drain of the MOS FET are formed in the support 1.

FIG. 12 shows a possible ultimate form of a MOS FET. Above the source 20 and the drain 21, the silicon oxide five is removed and electrical contacts 22, 23 are provided. The silicon 8a, originally instrinsic, is converted in the case of FIG. 12 into conductive silicon, for example by means of ion implantation or by silicidation. The region 8a now constitutes the gate of the MOS FET.

Figure 13:
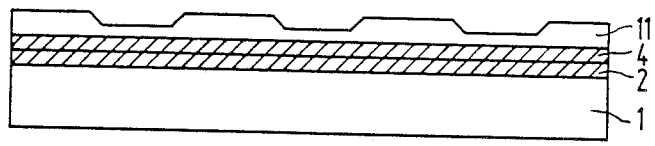
FIGS. 13 to 17 show successive stages in the formation of a three dimensional stack IC.

FIGS. 13 to 17 illustrate how three-dimensional stack IC's can be formed by means of the method described. FIG. 13 shows the thin semiconductor layer 11, which is provided in an insulating manner on a support as described with reference to FIGS. 1 to 3 or FIGS. 4 to 6. In the monocrystalline semiconductor layer 11, for example of silicon, IC's structures are formed. The technological operations then required lead to embossed parts locally being formed in the layer 11.

Figure 14:
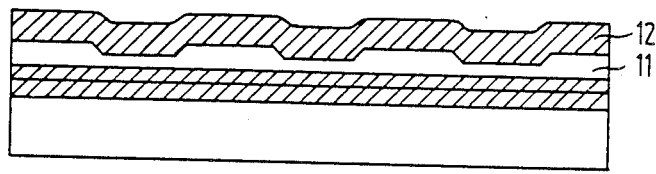
Figure 15:
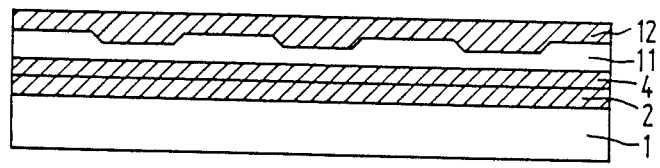

FIG. 14 shows that a silicon oxide layer 12 is deposited, for example pyrolytically, on the silicon layer 11. FIG. 15 illustrates that after planarization in a manner known per se a silicon oxide layer 12 having a flat surface is obtained on top of the semiconductor structures in the layer 11. The layer 12 may have a thickness of, for example, 0.5 $\mu$m.

The assembly shown in FIG. 15 is now used as a support body, on which a further thin semiconductor layer is provided in an insulating manner as described with reference to FIGS. 1 to 3 or FIGS. 4 to 6. The circuits formed with the semiconductor structures in the layer 11 are designated for the sake of clarity as a first register.

Figure 16:
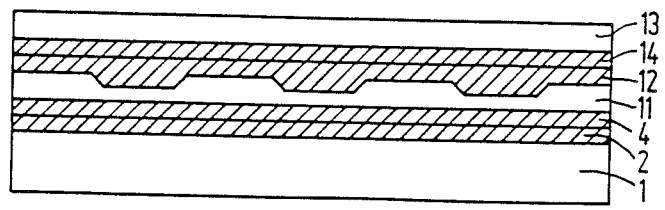

FIG. 16 shows the semiconductor layer 13, which was subjected to thinning by etching, and the electrically insulating layer 14 of, for example, silicon oxide; by ringing the layer 14 is wrung onto the layer 12. IC structures are formed again in the layer 13, as a result of which its upper surface takes the form shown in FIG. 17. These structures in the layer 13 form a second register. In the manner described, a three-diminsional stack IC is formed with the thin semiconductor layers being situated on an insulator. According to desire, several registers may be added to the stack.

Figure 17:
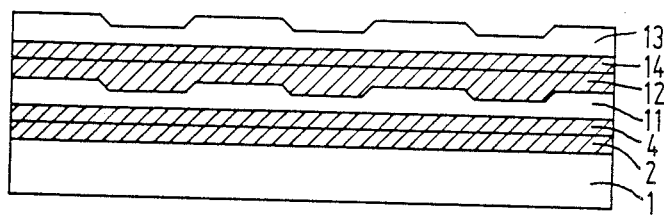

With compactly constructed stack IC's as shown in FIG. 17, special attention should be paid to the drainage of heat dissipated in the IC's. One of the possibilities of forced cooling may consist in that one or more Peltier elements acting as a cooling body are formed in at least one of the registers.

It is unfavourable for the packing density of the registers when components occupying comparatively much space, such as, for example, comparatively large capacitors, are included. Therefore, it is recommended to use at least one register mainly for accommodating such components occupying a large surface area.

Figure 18:
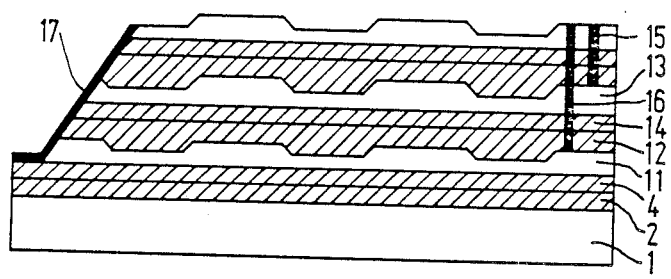
FIG. 18 shows a few forms of electrically conducting connections in the stack IC, in which optical elements are also indicated.

FIG. 18 shows a threedimensional stack IC comprising three registers. Different possibilities are illustrated of obtaining electrical connections between the various register. The connections 15 and 16 are obtained, for example, by first forming holes at areas desired for the connection, for example by means of reactive plasma etching. These holes are then filled with an electrically conducting material. The connection 15 in the embodiment shown forms an electrical contact between the third (upper) and second (central) register. The connection 16 extends as far as the first register.

FIG. 18 also shows a further form for obtaining an electrical contact between the registers. At the outer periphery of the stack IC, electrical conductors 17 can be formed at desired areas.

Figure 19:
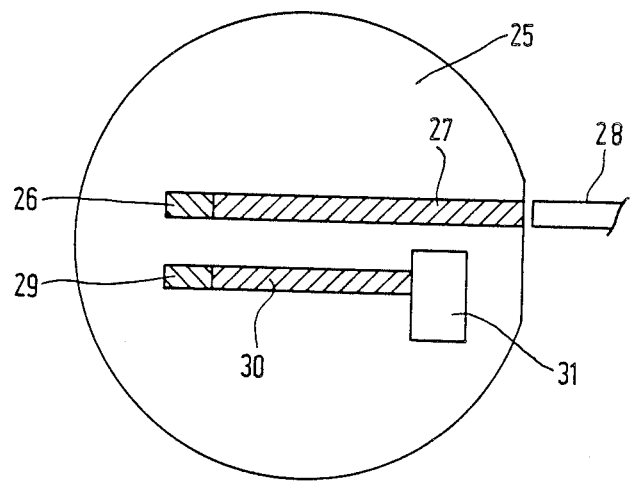
FIG. 19 is a plan view of an embodiment with optical elements.

FIG. 19 is a plan view of a possible register 25, in which optical elements are included.

The register 25 includes a laser or a light-emitting diode 26, which provides access to the environment via a photoconductor 27 of silicon oxide. Light energy is transported via an optical fiber 28 shown diagrammatically. The advantage of light transport in nonabsorbing media poor in scattering is that substantially no losses occur so that no heat dissipation takes place. Therefore, it may be efficacious to bring about a transmission of information in a register via light transport.

In the case of the second possibility shown diagrammatically in FIG. 19, a laser or a light-emitting diode 29 is connected through a photoconductor 30 of silicon oxide to a detector, in which light energy is converted into electrical energy.

It is also possible that the photoconductor extends in the vertical direction of the stack IC to the upper side thereof, in which event light energy can be supplied from the upper side to a desired register, or from a register to the outside.

The silicon oxide channels, such has the channels 27 and 30, may act not only as a photoconductor, but also as an electrical insulator between semiconductor components in the register.

The support body may consist of a single material in amorphous, polycrystalline or monocrystalline form. The support body may consist of an assembly of layers, in which event one of the layers is grown hetero-epitaxially on the base layer.

Besides passive electrically insulating properties, the support body may also have active bulk properties, such as magnetic properties (for example in yttrium-iron-garnet), piezoelectrical properties (for example in lead-zirconate-titanate), photorefractive properties (for example in $Bi_{12}GeO_{20}$ or $Bi_{12}SiO_{20}$) and electrooptical properties (for example in lithium niobate or potassium niobate).

The support body may also have layerwise active properties, generated by accoustic surface waves (for example in lithium niobate) and properties for producing staticmagnetic surface waves (for example in yttrium-iron-garnet grown heteroepitaxially on gadolium gallium garnet).

Electrically conducting and optically transparent parts of, for example, indium tin oxide may be included both in the support body and in the registers.

What is claimed is:

1. A method of manufacturing a semiconductor structure having at least a support body and a monocrystalline semiconductor body, said method comprising the steps of
   (a) providing both said support body and said monocrystalline semiconductor body with at least one flat optically smooth surface by a bulk-reducing polishing operation,
   (b) providing an electrically insulating layer on the optically smooth surface of at least said monocrystalline semiconductor body,
   (c) subjecting said electrically insulating layer on at least said monocrystalline semiconductor body to a bonding-activating operation, wherein said bonding-activating operation is a light surface smoothing operation or a chemical etching operation,
   (d) then contacting at least the optically smooth surface of said support body to said electrically insulating layer on said optically smooth surface of said monocrystalline semiconductor body in a dust-free atmosphere to obtain a mechanical connection,
   (e) then subjecting the contacted support body and monocrystalline semiconductor body to a heat treatment of at least 350° C.,
   (f) establishing a very firm bond between said support body and said monocrystalline semiconductor body, and
   (g) thereafter thinning by etching said monocrystalline semiconductor body to a predetermined thickness between 0.05 and 100 microns.

2. A method according to claim 1, wherein said monocrystalline semiconductor body is thinned to a thickness between 0.1 and 1 micron.

3. A method according to claim 1, wherein said monocrystalline semiconductor body is thinned to a thickness between 1 and 20 microns.

4. A method according to claim 1 or claim 2 or claim 3, wherein said step of thinning by etching is carried out by an isotropic etching technique, and wherein said monocrystalline semiconductor body is intrinsic or doped.

5. A method according to claim 1 or claim 2 or claim 3 further comprising:
   etching said thinned monocrystalline semiconductor body to form a plurality of separate regions,
   closing, by thermal oxidation or by deposition, spaces between said separate regions wherein deposition comprises depositing an insulating groove filling in said spaces between said separate regions,
   depositing insulating filling on said separate regions to a thickness exceeding the thickness of said thinned monocrystalline semiconductor body,
   planarizing the monocrystalline semiconductor body with the insulating filling thereon to thereby form a support of insulated semiconductor regions the surface of which is entirely flat.

6. A method according to claim 1 or claim 2 or claim 3 wherein a portion of said support body is formed with semiconductor material of AIII-BV type, said portion being contiguous with said optically smooth surface, wherein said monocrystalline semiconductor body is formed of silicon and said electrically insulating layer is formed of thermally grown silicon oxide, and further comprising:
   removing portions of said monocrystalline semiconductor body to said silicon oxide,
   forming doped regions constituting source and drain regions in said AIII-BV semiconductor material, and
   forming gate regions from said electrically insulating layer of silicon oxide between said doped regions for a MOS FET of said AIII-BV semiconductor material.

7. A method according to claim 6, wherein said AIII-BV semiconductor material is gallium arsenide.

8. A method according to claim 1 or claim 2 or claim 3, wherein said support body is formed with both electrical insulating properties and active bulk properties.

9. A method according to claim 8, wherein said active bulk properties include at least one of magnetic properties, piezoelectrical properties, photoreactive properties, and electrooptical properties.

10. A method according to claim 1 or claim 2 or claim 3, wherein said support body is formed with electrically insulating properties, layerwise active properties, and properties for producing static-magnetic surface waves.

11. A method according to claim 10, wherein said layerwise active properties include generating acoustic surface waves.

12. A method according to claim 1 or 2 or 3 further comprising:
   forming IC structures in the thinned monocrystalline semiconductor body to thereby form a first embossed outer surface, said IC structures forming a first register,
   depositing a silicon oxide layer on said first embossed outer surface,
   planarizing said silicon oxide layer to form an insulating layer of small thickness,
   forming a second thinned monocrystalline semiconductor body having an electrically insulating layer on said planarized silicon oxide layer,
   forming IC structures in said second thinned monocrystalline semiconductor body to thereby form a second embossed outer surface, said IC structures forming a second register,
   carrying out a repetition of analogous steps to form additional ICs thereby forming a three-dimensional stack IC.

13. A method according to claim 12, wherein at least one Peltier element is formed in at least one of said registers for cooling said three-dimensional stack IC.

14. A method according to claim 12, wherein at least one of said registers is used to accommodate components occupying a large surface area.

15. A method according to claim 14, wherein said components are capacitors.

16. A method according to claim 12 further comprising:
etching holes into said registers at location accommodating electrical connections, and
filling said holes with an electrically conducting material.

17. A method according to claim 12, further comprising providing electrical conductors at the outer circumference of said three-dimensional stack IC to establish connections between different registers.

18. A method according to claim 12 further comprising:
providing an optical fiber arrangement to feed light energy to at least one of said registers, and
providing transparent channels in said three dimensional stack IC to transport said light energy to said registers.

19. A method according to claim 18, wherein transparent channels are formed in the plane of circuits to be energized in said registers.

20. A method according to claim 18, wherein said transparent channels are formed to transmit light energy at right angles to planes of circuits to be energized in said registers.

21. A method according to claim 12, wherein said monocrystalline semiconductor bodies to be connected are formed (1) of semiconductor material for fulfilling mainly electrical functions, and (2) of semiconductor material for fulfilling mainly optical functions.

22. A method according to claim 21, wherein said semiconductor material for fulfilling mainly optical functions is configured with light-dissipating leads for dissipating light energy to the outside of said semiconductor structure or for internally converting light energy into an electrical signal.

23. A method according to claim 21, further comprising forming insulating channels in said registers to have a dual function of electrical insulation and light conduction.

24. A method according to claim 1, wherein said light surface smoothing operation includes smoothing a surface of said electrically insulating layer by removing microscopic unevenness.

25. A method according to claim 1, wherein said chemical etching operation includes lightly etching a surface of said electrically insulating layer.

26. A method of manufacturing a semiconductor structure having at least a support body and a monocrystalline semiconductor body, said method comprising the steps of
(a) providing both said support body and said monocrystalline semiconductor body with at least one flat optically smooth surface by a bulk-reducing polishing operation,
(b) providing an electrically insulating layer on the optically smooth surface of at least said monocrystalline semiconductor body,
(c) subjecting said electrically insulating layer on at least said monocrystalline semiconductor body to a bonding-activating operation,
(d) then contacting at least the optically smooth surface of said support body to said electrically insulating layer on said optically smooth surface of said monocrystalline semiconductor body in a dust-free atmosphere to obtain a mechanical connection,
(e) then subjecting the contacted support body and monocrystalline semiconductor body to a heat treatment of at least 350°C.,
(f) establishing a very firm bond between said support body and said monocrystalline semiconductor body, and
(g) thereafter thinning by etching said monocrystalline semiconductor body to a predetermined thickness between 0.05 and 100 microns,
wherein said monocrystalline semiconductor body includes a highly doped first layer and a weakly doped second layer epitaxially grown on said first layer, and wherein said step of thinning by etching is carried out by an electrochemical etch treatment to etch away completely said first layer, said electrochemical etch treatment being stopped at said second layer.

27. A method according to claim 26, wherein said monocrystalline semiconductor body is thinned to a thickness between 0.1 and 1 micron.

28. A method according to claim 26, wherein said monocrystalline semiconductor body is thinned to a thickness between 1 and 20 microns.

29. A method according to claim 26, wherein said bonding-activating operation is a light surface smoothing operation.

30. A method according to claim 26, wherein said bonding-activating operation is a chemical etching operation.

31. A method according to claim 26, wherein said bonding-activating operation includes the steps of providing a layer of wet chemically spun glass, removing organic components from said layer at a temperature of about 200° C., and densifying said layer to glass at a temperature of at least 800° C.

32. A method of manufacturing a semiconductor structure having at least a support body and a monocrystalline semiconductor body, said method comprising the steps of
(a) forming said support body by growing a magnetic garnet layer on a first non-magnetic garnet layer,
(b) forming a magnetic domain memory or Bloch line memory,
(c) providing both said support body and said monocrystalline semiconductor body with at least one flat optically smooth surface by a bulk-reducing polishing operation,
(d) providing an electrically insulating layer on the optically smooth surface of at least said monocrystalline semiconductor body,
(e) subjecting said electrically insulating layer on at least said monocrystalline semiconductor body to a bonding-activating operation,
(f) then contacting at least the optically smooth surface of said support body to said electrically insulating layer on said optically smooth surface of said monocrystalline semiconductor body in a dust-free atmosphere to obtain a mechanical connection,
(g) then subjecting the contacted support body and monocrystalline semiconductor body to a heat treatment of at least 350° C., (h) establishing a very firm bond between said support body and said monocrystalline semiconductor body, and (i) thereafter thinning by etching said monocrystalline semiconductor body to a predetermined thickness between 0.05 and 100 microns, (j) forming semiconductor elements in said monocrystalline semiconductor body to obtain an electrical circuit for controlling said magnetic domain memory or saiud bloch line memory.

33. A method according to claim 32, wherein said monocrystalline semiconductor body is thinned to a thickness between 0.1 and 1 micron.

34. A method according to claim 32, wherein said monocrystalline semiconductor body is thinned to a thickness between 1 and 20 microns.

35. A method according to claim 32, wherein said bonding-activating operation is a light surface smoothing operation.

36. A method according to claim 32, wherein said bonding-activating operation is a chemical etching operation.

37. A method according to claim 32, wherein said bonding-activating operation includes the steps of providing a layer of wet chemically spun glass, removing organic components from said layer at a temperature of about 200° C., and densifying said layer to glass at a temperature of at least 800° C.

38. A method of manufacturing a semiconductor structure having at least a support body and a monocrystalline semiconductor body, said method comprising the steps of (a) forming said support body by growing a magnetic garnet layer on a first non-magnetic garnet layer, (b) forming a magnetic domain memory or Bloch line memory, (c) providing both said support body and said monocrystalline semiconductor body with at least one flat optically smooth surface by a bulk-reducing polishing operation, (d) providing an electrically insulating layer on the optically smooth surface of at least said monocrystalline semiconductor body, (e) subjecting said electrically insulating layer on at least said monocrystalline semiconductor body to a bonding-activating operation, (f) then contacting at least the optically smooth surface of said support body to said electrically insulating layer on said optically smooth surface of said monocrystalline semiconductor body in a dust-free atmosphere to obtain a mechanical connection, (g) then subjecting the contacted support body and monocrystalline semiconductor body to a heat treatment of at least 350° C., (h) establishing a very firm bond between said support body and said monocrystalline semiconductor body, and (i) thereafter thinning by etching said monocrystalline semiconductor body to a predetermined thickness between 0.05 and 100 microns, (j) forming semiconductor elements as an electrical memory to provide an interaction between said magnetic memory and said electric memory.

39. A method according to claim 38, wherein said monocrystalline semiconductor body is thinned to a thickness between 0.1 and 1 micron.

40. A method according to claim 38, wherein said monocrystalline semiconductor body is thinned to a thickness between 1 and 20 microns.

41. A method according to claim 38, wherein said bonding-activating operation is a light surface smoothing operation.

42. A method according to claim 38, wherein said bonding-activating operation is a chemical etching operation.

43. A method according to claim 38, wherein said bonding-activating operation includes the steps of providing a layer of wet chemically spun glass, removing organic components from said layer at a temperature of about 200° C., and densifying said layer to glass at a temperature of at least 800° C.

* * * * *